United States Patent
Perozo et al.

(10) Patent No.: US 9,268,722 B1
(45) Date of Patent: Feb. 23, 2016

(54) SHARING MEMORY USING PROCESSOR WAIT STATES

(71) Applicant: Marvell International Ltd., Hamilton (BM)

(72) Inventors: Angel G. Perozo, Mission Viejo, CA (US); William W. Dennin, III, Mission Viejo, CA (US)

(73) Assignee: Marvell International LTD., Hamilton (BM)

( * ) Notice: Subject to any disclaimer, the term of this patent is extended or adjusted under 35 U.S.C. 154(b) by 192 days.

(21) Appl. No.: 13/905,248

(22) Filed: May 30, 2013

Related U.S. Application Data

(60) Provisional application No. 61/653,871, filed on May 31, 2012, provisional application No. 61/668,812, filed on Jul. 6, 2012.

(51) Int. Cl.
  *G06F 12/00* (2006.01)
  *G06F 13/16* (2006.01)
  *G11C 7/10* (2006.01)

(52) U.S. Cl.
  CPC .......... *G06F 13/1663* (2013.01); *G11C 7/1075* (2013.01)

(58) Field of Classification Search
  None
  See application file for complete search history.

(56) References Cited

U.S. PATENT DOCUMENTS

| 4,594,657 A * | 6/1986 | Byrns .......................... 710/241 |
| 2010/0005244 A1 * | 1/2010 | Weiberle et al. .............. 711/130 |
| 2010/0077157 A1 * | 3/2010 | Gregorius et al. ............ 711/149 |
| 2011/0004731 A1 * | 1/2011 | Tsuruta ........................ 711/146 |

OTHER PUBLICATIONS

"Advanced Microcontroller Bus Architecture" May 24, 2012. retrieved from http://en.wikipedia.org/wiki/Advanced_Microcontroller_Bus_Architecture as archived by www.archive.org.*

* cited by examiner

*Primary Examiner* — Daniel Tsui

(57) ABSTRACT

Apparatus having corresponding methods and computer-readable media comprise: a memory having a plurality of ports; a plurality of processors, wherein each processor is configured to access a respective port of the memory, and wherein each processor is configured to wait responsive to assertion of a respective wait signal; and an arbiter configured to assert the wait signals responsive to memory enable signals asserted by the processors such that the memory is accessed by only one of the processors at a time.

17 Claims, 7 Drawing Sheets

SHARING MEMORY USING PROCESSOR WAIT STATES

CROSS-REFERENCE TO RELATED APPLICATIONS

This disclosure claims the benefit of U.S. Provisional Patent Application Ser. No. 61/653,871, filed on May 31, 2012, entitled "SUPPORT OF SYNCHRONIZATION PRIMITIVES," and claims the benefit of U.S. Provisional Patent Application Ser. No. 61/668,812, filed on Jul. 6, 2012, entitled "SUPPORT OF SYNCHRONIZATION PRIMITIVES," the disclosures thereof incorporated by reference herein in their entirety.

FIELD

The present disclosure relates generally to the field of multiprocessor systems. More particularly, the present disclosure relates to sharing direct attached memory in such systems.

BACKGROUND

This background section is provided for the purpose of generally describing the context of the disclosure. Work of the presently named inventor(s), to the extent the work is described in this background section, as well as aspects of the description that may not otherwise qualify as prior art at the time of filing, are neither expressly nor impliedly admitted as prior art against the present disclosure.

Modern multiprocessor systems include multiple processors or processor cores that share a common resource such as a memory subsystem. To share the common resource, accesses to the common resource must be synchronized. Problems that must be solved in such systems include controlling thread interactions, avoiding race conditions, and the like. One conventional solution involves the use of exclusive monitors.

FIG. 1 shows a conventional multiprocessor system 100 that employs exclusive monitors. For clarity only two processors are shown. The multiprocessor system 100 includes two processors 102A and 102B, a memory subsystem 104, a bus 106, and a global monitor 108. The processors 102 communicate with the memory subsystem 104 over the bus 106. Each processor 102A,B includes a respective local monitor 110A, B. The exclusive monitors 108, 110 are high-level tools that provide synchronization for access to the memory subsystem using synchronization primitives such as semaphores and the like over the bus 106.

SUMMARY

In general, in one aspect, an embodiment features an apparatus comprising: a memory having a plurality of ports; a plurality of processors, wherein each processor is configured to access a respective port of the memory, and wherein each processor is configured to wait responsive to assertion of a respective wait signal; and an arbiter configured to assert the wait signals responsive to memory enable signals asserted by the processors such that the memory is accessed by only one of the processors at a time.

Embodiments of the apparatus can include one or more of the following features. In some embodiments, the arbiter is further configured to assert a first one of the wait signals for a first one of the processors responsive to i) the first one of the processors asserting a first one of the memory enable signals, and ii) a second one of the processors accessing the memory. Some embodiments comprise a common resource; wherein the memory is configured to store a synchronization primitive; wherein the processors share the common resource according to the synchronization primitive. In some embodiments, the common resource comprises a memory subsystem. Some embodiments comprise a bus in communication with the processors and the common resource; and a global monitor configured to monitor traffic on the bus; wherein each of the processors comprise a respective local monitor; and wherein the processors share the common resource in accordance with the global monitor and the local monitors. In some embodiments, the bus comprises: an advanced extensible interface (AXI) bus. In some embodiments, each processor is implemented as a respective core of a multi-core processor. In some embodiments, the memory is implemented as a direct attached memory. Some embodiments comprise an integrated circuit comprising the apparatus.

In general, in one aspect, an embodiment features a method comprising: receiving a plurality of memory enable signals asserted by a respective plurality of processors, wherein each processor is configured to access a respective port of a multi-port memory, and wherein each processor is configured to wait responsive to assertion of a respective wait signal; and asserting the wait signals responsive to the memory enable signals such that the multi-port memory is accessed by only one of the processors at a time.

Embodiments of the method can include one or more of the following features. Some embodiments comprise asserting a first one of the wait signals for a first one of the processors responsive to i) the first one of the processors asserting a first one of the memory enable signals, and ii) a second one of the processors accessing the multi-port memory. Some embodiments comprise storing a synchronization primitive in the multi-port memory; and sharing a common resource among the processors according to the synchronization primitive. In some embodiments, the common resource comprises a memory subsystem. Some embodiments comprise exchanging traffic between the processors and the common resource over a bus; monitoring traffic on the bus using a global monitor; monitoring traffic for each processor using a respective local monitor; and sharing the common resource in accordance with the global monitor and the local monitors. In some embodiments, the memory is implemented as a direct attached memory.

In general, in one aspect, an embodiment features computer-readable media embodying instructions executable by a computer to perform functions comprising: receiving a plurality of memory enable signals asserted by a respective plurality of processors, wherein each processor is configured to access a respective port of a multi-port memory, and wherein each processor is configured to wait responsive to assertion of a respective wait signal; and asserting the wait signals responsive to the memory enable signals.

Embodiments of the computer-readable media can include one or more of the following features. In some embodiments, the functions further comprise: asserting a first one of the wait signals for a first one of the processors responsive to i) the first one of the processors asserting a first one of the memory enable signals, and ii) a second one of the processors accessing the multi-port memory. In some embodiments, the functions further comprise storing a synchronization primitive in the multi-port memory; and sharing a common resource among the processors according to the synchronization primitive. In some embodiments, the functions further comprise exchanging traffic between the processors and the common resource over a bus; monitoring traffic on the bus using a global monitor; monitoring traffic for each processor using a respective local monitor; and sharing the common resource in accordance with the global monitor and the local monitors. In some embodiments, the memory is implemented as a direct attached memory.

The details of one or more implementations are set forth in the accompanying drawings and the description below. Other features will be apparent from the description and drawings, and from the claims.

Figure 1:
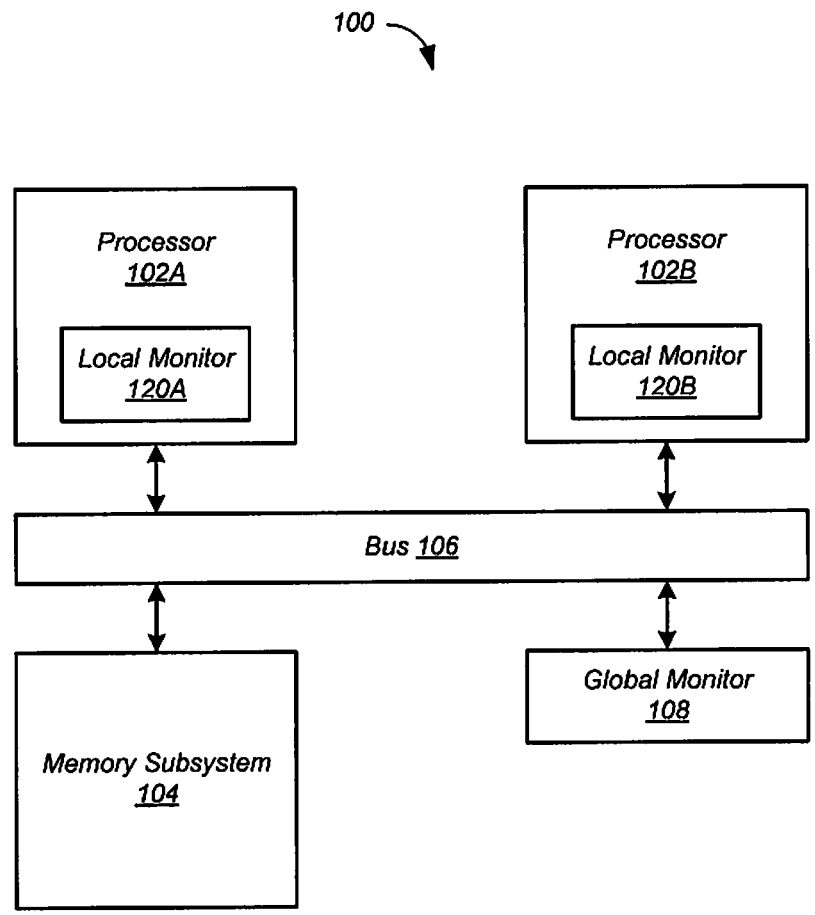
FIG. 1 shows a conventional multiprocessor system that employs exclusive monitors.

The leading digit(s) of each reference numeral used in this specification indicates the number of the drawing in which the reference numeral first appears.

DETAILED DESCRIPTION

Embodiments of the present disclosure provide memory sharing using processor wait states. According to these embodiments, processors having wait states share a multi-port memory under the control of an arbiter that uses the wait states to control access to the memory. In some embodiments, the multi-port memory is implemented as a direct attached memory. In some embodiments, the memory stores synchronization primitives that are used by the processors to share a common resource such as a memory subsystem and the like. The memory subsystems described herein can include any sort of memory, including solid-state memory, disk drives, optical memory, and the like. The described embodiments provide more rapid synchronization than conventional bus-based solutions. In addition, some embodiments include exclusive monitors that are used by the processors to share the common resource.

Figure 2:
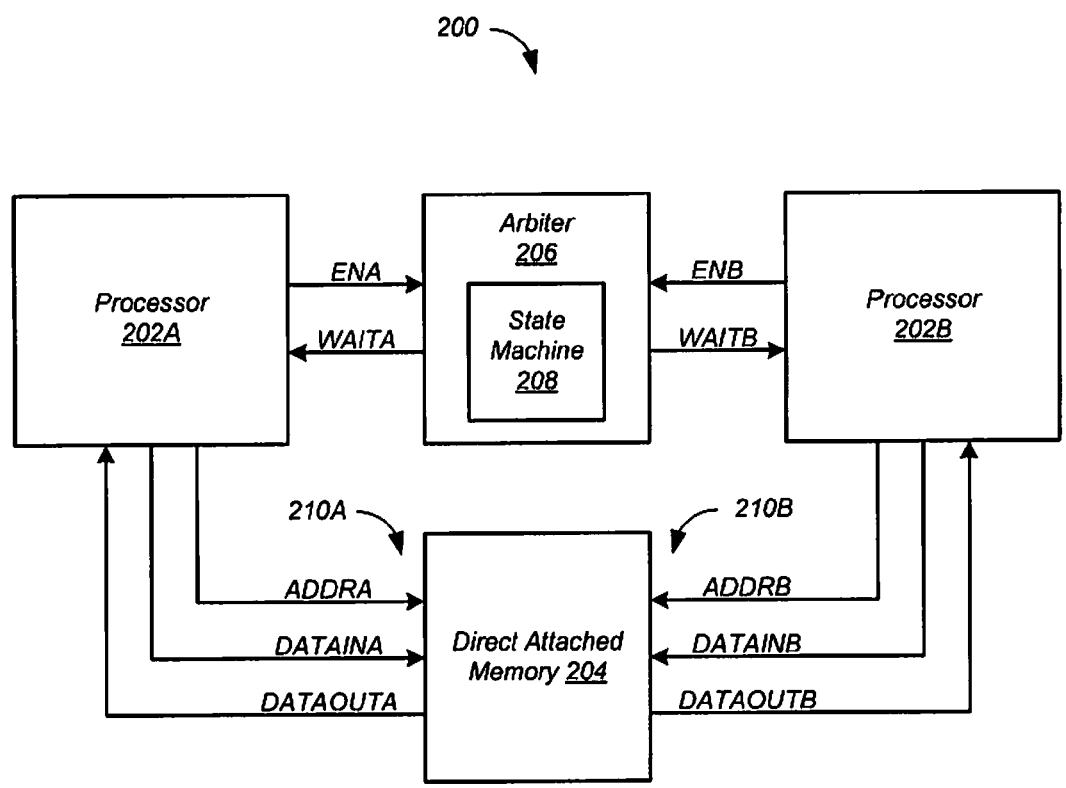
FIG. 2 shows elements of a multiprocessor system according to one embodiment.

FIG. 2 shows elements of a multiprocessor system 200 according to one embodiment. Although in the described embodiment elements of the multiprocessor system 200 are presented in one arrangement, other embodiments may feature other arrangements. For example, elements of the multiprocessor system 200 can be implemented in hardware, software, or combinations thereof. For clarity only two processors are shown. However, other embodiments feature more processors.

Referring to FIG. 2, the multiprocessor system 200 includes two processors 202A and 202B, a two-port direct attached memory 204, and an arbiter 206. The direct attached memory 204 can be implemented as a tightly-coupled memory or the like. The processors 202 can be implemented as cores of a multi-core processor. The arbiter 206 implements a state machine 208. The arbiter 206 can be implemented as a logic circuit or the like. The processors 202, the two-port direct attached memory 204, and the arbiter 206 can be implemented together as a single integrated circuit.

The direct attached memory 204 includes two memory ports 210A,B. Each processor 202 is connected to a respective one of the memory ports 210. In the present example, the first processor 202A is connected to the first memory port 210A, and the second processor 202B is connected to the second memory port 210B. The connections between each processor 202 and the respective memory port 210 include an address bus, a write bus, and a read bus. In the present example, the connections between the first processor 202A and the first memory port 210A include address bus ADDRA, write bus DATAINA, and read bus DATAOUTA, and the connections between the second processor 202B and the second memory port 210B include address bus ADDRB, write bus DATAINB, and read bus DATAOUTB.

Each processor 202 asserts a respective memory enable signal to request access to the memory 204. In the present example, the first processor 202A asserts a memory enable signal ENA, and the second processor 202B asserts a memory enable signal ENB. Responsive to these memory enable signals, the arbiter 206 asserts wait signals in accordance with the state machine 208. In the present example, the arbiter 206 provides a wait signal WAITA to the first processor 202A, and provides a wait signal WAITB to the second processor 202B. Responsive to the respective wait signal being asserted, the respective processor 202 waits until that wait signal is negated. In this manner, the arbiter 206 can force one processor 202 to wait while the other processor 202 accesses the memory 204. In order to ensure that only one processor 202 accesses the direct attached memory 204 at a time, the arbiter 206 negates only one wait signal at a time.

Figure 3:
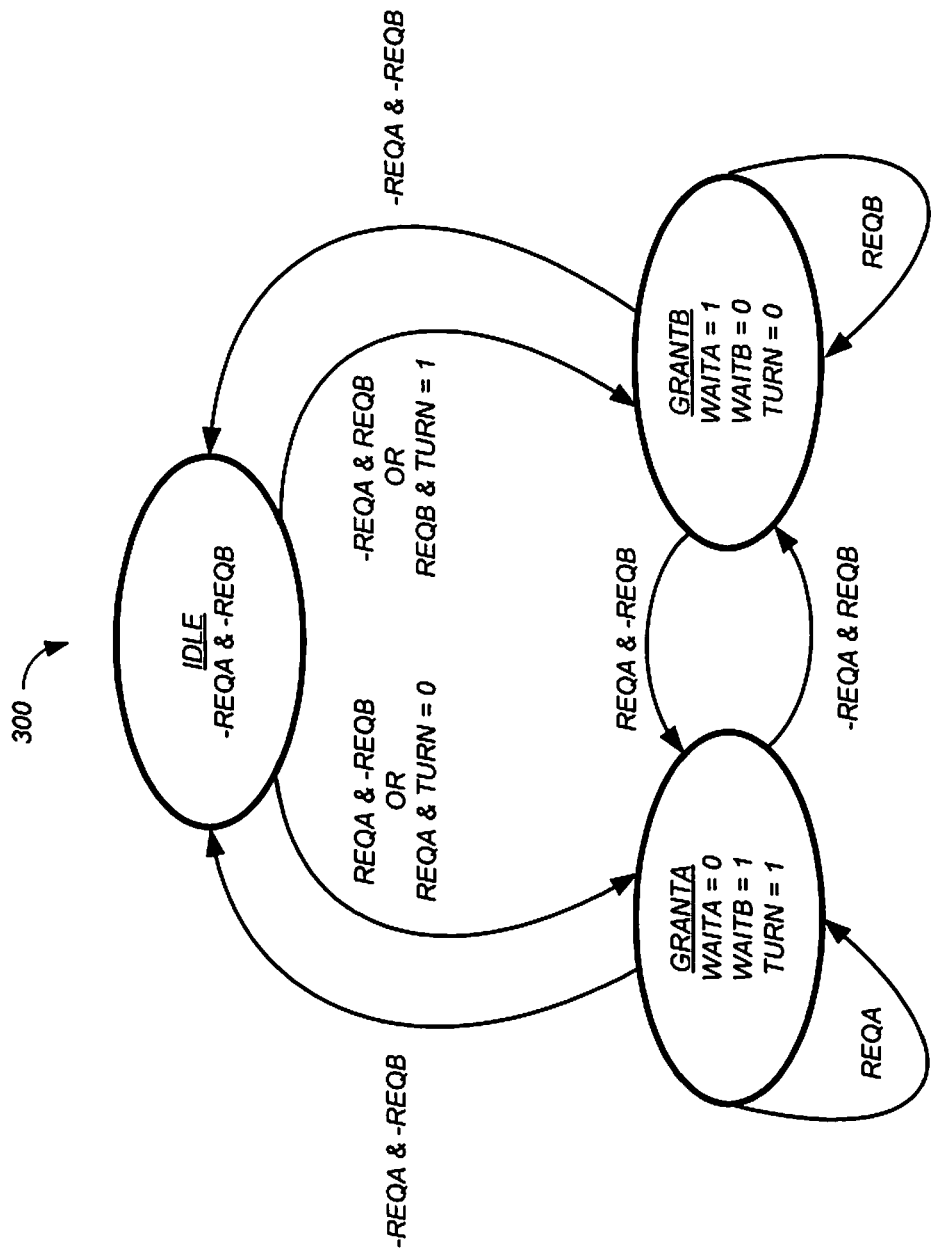
FIG. 3 shows a state diagram for the state machine of FIG. 2 according to one embodiment.

FIG. 3 shows a state diagram 300 for the state machine 208 of FIG. 2 according to one embodiment. Referring to FIG. 3, the state machine 208 includes an IDLE state, a GRANTA state, and a GRANTB state. In response to a processor 202 asserting a memory enable signal, the arbiter 206 generates a corresponding internal signal. In the present example, the arbiter 206 generates a first internal signal REQA responsive to the first processor 202A asserting the WAITA signal, and generates a second internal signal REQB responsive to the second processor 202B asserting the WAITB signal. The state machine 208 also employs an internal flag TURN to determine access in case of simultaneous access requests from the processors 202. In case of simultaneous requests, the arbiter 206 grants access to the first processor 202A when TURN=0, and grants access to the second processor 202B when TURN=1.

When neither processor 202 is asserting a wait signal, the state machine 208 remains in the IDLE state, where REQA and REQB are both negated (–REQA & –REQB). The state machine 208 moves to the GRANTA state in either of two cases. In one case, the first processor 202A asserts its memory enable signal ENA while the second processor 202B is not asserting its memory enable signal ENB (REQA & –REQB). In the other case, the first processor 202A asserts its memory enable signal ENA during its turn, regardless of the status of the memory enable signal ENB of the second processor 202B (REQA & TURN=0).

In the GRANTA state, the arbiter 206 negates the signal WAITA, asserts the signal WAITB, and toggles the turn flag (WAITA=0, WAITB=1, TURN=1). Thus in the GRANTA state, the arbiter 206 allows the first processor 202A to access the memory 204, while preventing the second processor 202B from accessing the memory 204. The state machine 208 remains in the GRANTA state while the enable signal ENA remains asserted.

If the first processor 202A negates its WAITA signal while the WAITB signal of the second processor 202B remains negated (−REQA & −REQB), the state machine 208 returns to the IDLE state. But if the first processor 202A negates its WAITA signal and the second processor 202B asserts its WAITB signal (−REQA & REQB), the state machine 208 moves to the GRANTB state.

The state machine 208 moves from the IDLE state to the GRANTB state in either of two cases. In one case, the second processor 202B asserts its memory enable signal ENB while the first processor 202A is not asserting its memory enable signal ENA (−REQA & REQB). In the other case, the second processor 202B asserts its memory enable signal ENB during its turn, regardless of the status of the memory enable signal ENA of first processor 202A (REQB & TURN=1).

In the GRANTB state, the arbiter 206 negates the signal WAITB, asserts the signal WAITA, and toggles the turn flag (WAITA=1, WAITB=0, TURN=0). Thus in the GRANTB state, the arbiter 206 allows the second processor 202B to access the memory 204, while preventing the first processor 202A from accessing the memory 204. The state machine 208 remains in the GRANTB state while the enable signal ENB remains asserted.

If the second processor 202B negates its WAITB signal while the WAITA signal of the first processor 202A remains negated (−REQA & −REQB), the state machine 208 returns to the IDLE state. But if the second processor 202B negates its WAITB signal and the first processor 202A asserts its WAITA signal (REQA & −REQB), the state machine 208 moves to the GRANTA state.

Figure 4:
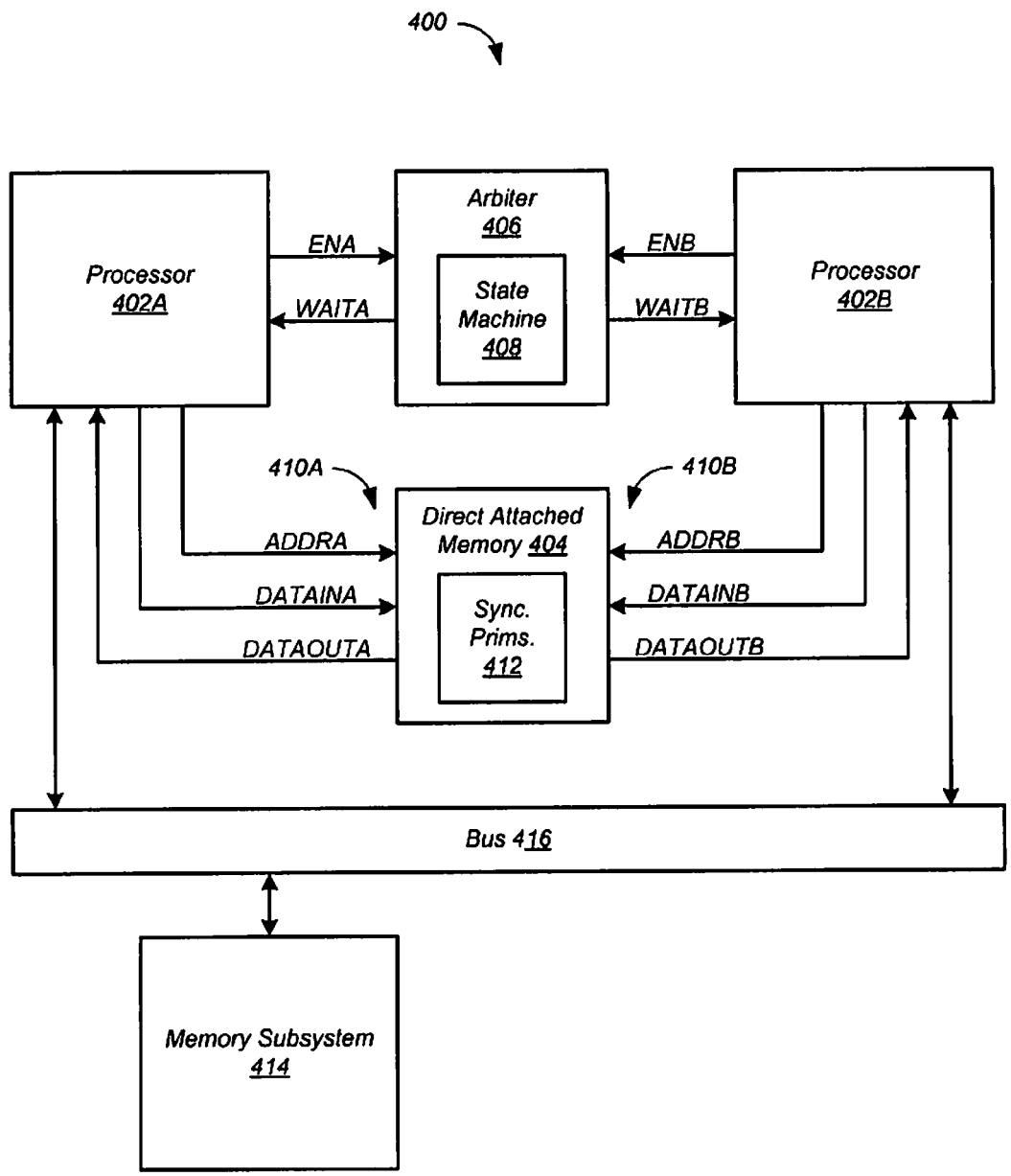
FIG. 4 shows elements of such a multiprocessor system according to an embodiment where a shared multi-port memory is used by multiple processors to build synchronization primitives, and the processors use the synchronization primitives to share a common resource.

In some embodiments, a shared multi-port memory is used by multiple processors to build synchronization primitives, and the processors use the synchronization primitives to share a common resource such as a memory subsystem or the like. FIG. 4 shows elements of such a system 400 according to one embodiment. Although in the described embodiment elements of the multiprocessor system 400 are presented in one arrangement, other embodiments may feature other arrangements. For example, elements of the multiprocessor system 400 can be implemented in hardware, software, or combinations thereof. For clarity only two processors are shown. However, other embodiments feature more processors.

Referring to FIG. 4, the multiprocessor system 400 includes two processors 402A and 402B, a two-port direct attached memory 404, and an arbiter 406. The processors 402 can be implemented as cores of a multi-core processor. The arbiter 406 implements a state machine 408. The arbiter 406 can be implemented as a logic circuit or the like. The processors 402, the two-port direct attached memory 404, and the arbiter 406 can be implemented together as a single integrated circuit. The multiprocessor system 400 also includes a memory subsystem 414, and a bus 416 in communication with the processors 402 and the memory subsystem 414. In some embodiments, the bus 416 may be an advanced extensible interface (AXI) and/or have an advanced microcontroller bus architecture (AMBA) and use an AMBA protocol. The processors 402 build and store synchronization primitives 412 in the direct attached memory 404, and use the synchronization primitives 412 to share the memory subsystem 414.

The direct attached memory 404 includes two memory ports 410A,B. Each processor 402 is connected to a respective one of the memory ports 410. In the present example, the first processor 402A is connected to the first memory port 410A, and the second processor 402B is connected to the second memory port 410B. The connections between each processor 402 and the respective memory port 410 include an address bus, a write bus, and a read bus. In the present example, the connections between the first processor 402A and the first memory port 410A include address bus ADDRA, write bus DATAINA, and read bus DATAOUTA, and the connections between the second processor 402B and the second memory port 410B include address bus ADDRB, write bus DATAINB, and read bus DATAOUTB.

Each processor 402 asserts a respective memory enable signal to request access to the memory 404. In the present example, the first processor 402A asserts a memory enable signal ENA, and the second processor 402B asserts a memory enable signal ENB. Responsive to these memory enable signals, the arbiter 406 asserts wait signals in accordance with the state machine 408. In the present example, the arbiter 406 provides a wait signal WAITA to the first processor 402A, and provides a wait signal WAITB to the second processor 402B. Responsive to the respective wait signal being asserted, the respective processor 402 waits until that wait signal is negated. In this manner, the arbiter 406 can force one processor 402 to wait while the other processor 402 accesses the memory 404.

Figure 5:
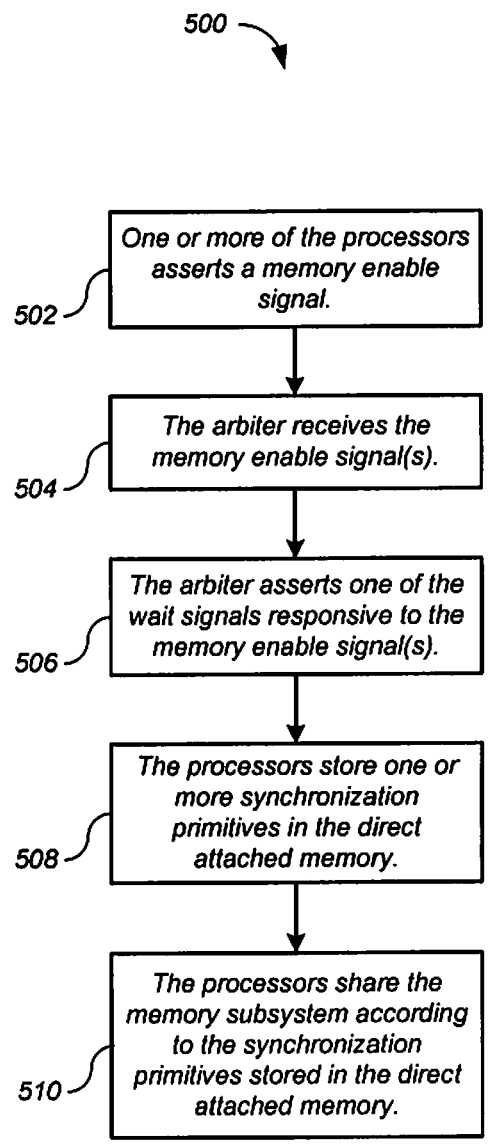
FIG. 5 shows a process for the multiprocessor system of FIG. 4 according to one embodiment.

FIG. 5 shows a process 500 for the multiprocessor system 400 of FIG. 4 according to one embodiment. Although in the described embodiments the elements of process 500 are presented in one arrangement, other embodiments may feature other arrangements. For example, in various embodiments, some or all of the elements of process 500 can be executed in a different order, concurrently, and the like. Also some elements of process 500 may not be performed, and may not be executed immediately after each other. In addition, some or all of the elements of process 500 can be performed automatically, that is, without human intervention.

Referring to FIG. 5, at 502, one or more of the processors 402 asserts a memory enable signal. At 504, the arbiter 406 receives the memory enable signal(s). At 506, responsive to the memory enable signal(s), the arbiter 406 asserts one of the wait signals, thereby granting access to the direct attached memory 404 such that the memory 404 is accessed by only one of the processors 402 at a time. The arbiter asserts the wait signals in accordance with the operation of the state machine 408. The state machine 408 can operate, for example, in accordance with the state diagram 300 of FIG. 3. At 508, the processors 402 store one or more synchronization primitives 412 in the direct attached memory 404. At 510, the processors share the memory subsystem 414 according to the one or more synchronization primitives 412.

Figure 6:
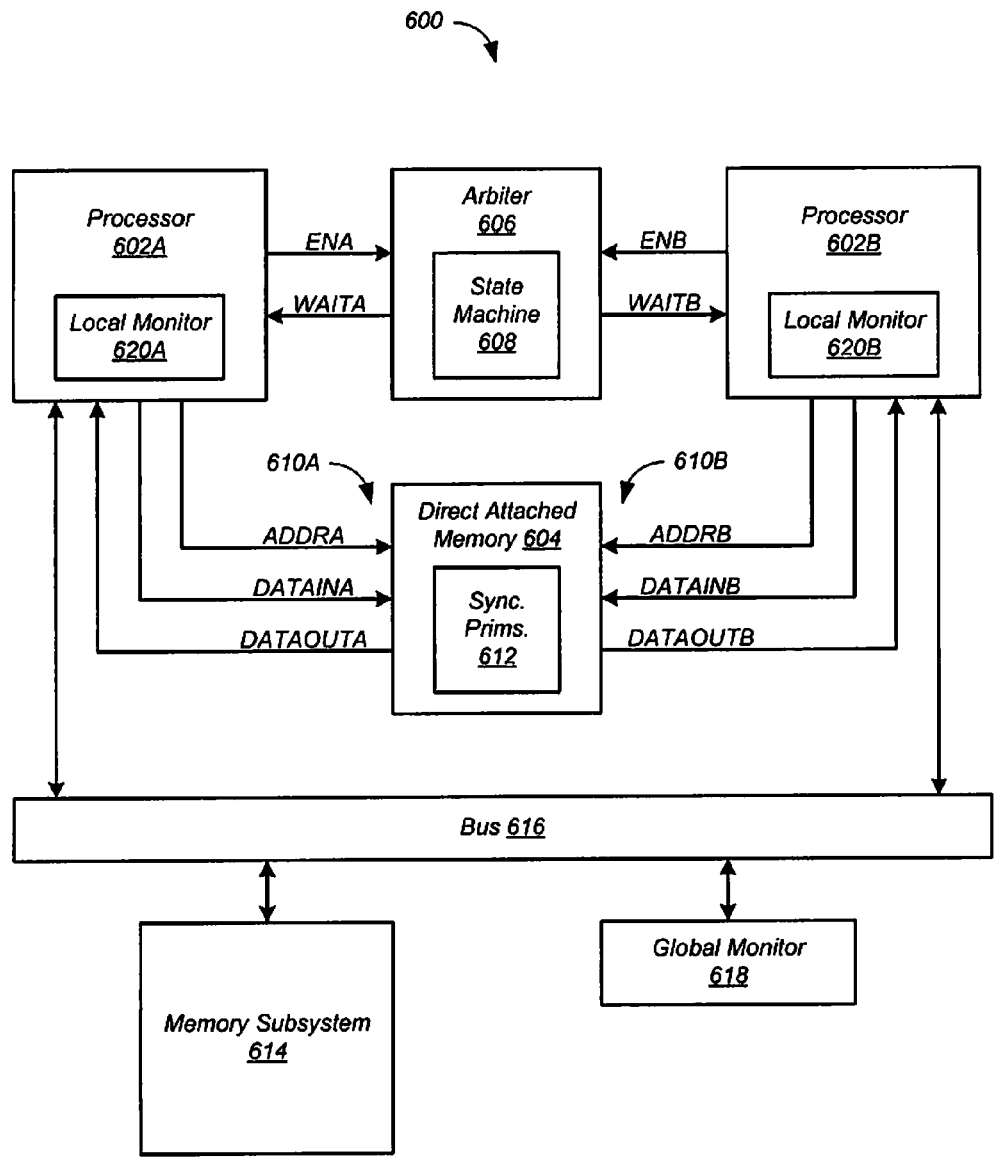
FIG. 6 shows elements of a multiprocessor system according to an embodiment where a shared multi-port memory is used by multiple processors to build synchronization primitives, and the processors use the synchronization primitives, as well as exclusive monitors, to share a common resource.

In some embodiments, a shared multi-port memory is used by multiple processors to build synchronization primitives, and the processors use the synchronization primitives, as well as exclusive monitors, to share a common resource such as a memory subsystem or the like. FIG. 6 shows elements of such a system 600 according to one embodiment. Although in the described embodiment elements of the multiprocessor system 600 are presented in one arrangement, other embodiments may feature other arrangements. For example, elements of the multiprocessor system 600 can be implemented in hardware, software, or combinations thereof. For clarity only two processors are shown. However, other embodiments feature more processors.

Referring to FIG. 6, the multiprocessor system 600 includes two processors 602A and 602B, a two-port direct attached memory 604, and an arbiter 606. The processors 602 can be implemented as cores of a multi-core processor. The arbiter 606 implements a state machine 608. The arbiter 606 can be implemented as a logic circuit or the like. The processors 602, the two-port direct attached memory 604, and the arbiter 606 can be implemented together as a single integrated circuit. The multiprocessor system 600 also includes a memory subsystem 614, and a bus 616 in communication with the processors 602 and the memory subsystem 614. In some embodiments, the bus 616 may be an advanced extensible interface (AXI) and/or have an advanced microcontroller bus architecture (AMBA) and use an AMBA protocol. The processors 602 build and store synchronization primitives 612 in the direct attached memory 604, and use the synchronization primitives 612 to share the memory subsystem 614.

The multiprocessor system 600 also includes a plurality of exclusive monitors. A global monitor 618 monitors traffic on the bus 616. Each processor 602A,B includes a respective local monitor 620A,B. The exclusive monitors 618, 620 are high-level tools that provide synchronization for access to the memory subsystem 414 using synchronization primitives such as semaphores and the like over the bus 616.

The direct attached memory 604 includes two memory ports 610A,B. Each processor 602 is connected to a respective one of the memory ports 610A. In the present example, the first processor 602A is connected to the first memory port 610A, and the second processor 602B is connected to the second memory port 610B. The connections between each processor 602 and the respective memory port 610 include an address bus, a write bus, and a read bus. In the present example, the connections between the first processor 602A and the first memory port 610A include address bus ADDRA, write bus DATAINA, and read bus DATAOUTA, and the connections between the second processor 602B and the second memory port 610B include address bus ADDRB, write bus DATAINB, and read bus DATAOUTB.

Each processor 602 asserts a respective memory enable signal to request access to the memory 604. In the present example, the first processor 602A asserts a memory enable signal ENA, and the second processor 602B asserts a memory enable signal ENB. Responsive to these memory enable signals EN, the arbiter 606 asserts wait signals in accordance with the state machine 608. In the present example, the arbiter 606 provides a wait signal WAITA to the first processor 602A, and provides a wait signal WAITB to the second processor 602B. Responsive to the respective wait signal being asserted, the respective processor 602 waits until that wait signal is negated. In this manner, the arbiter 606 can force one processor 602 to wait while the other processor 602 accesses the memory 604.

Figure 7:
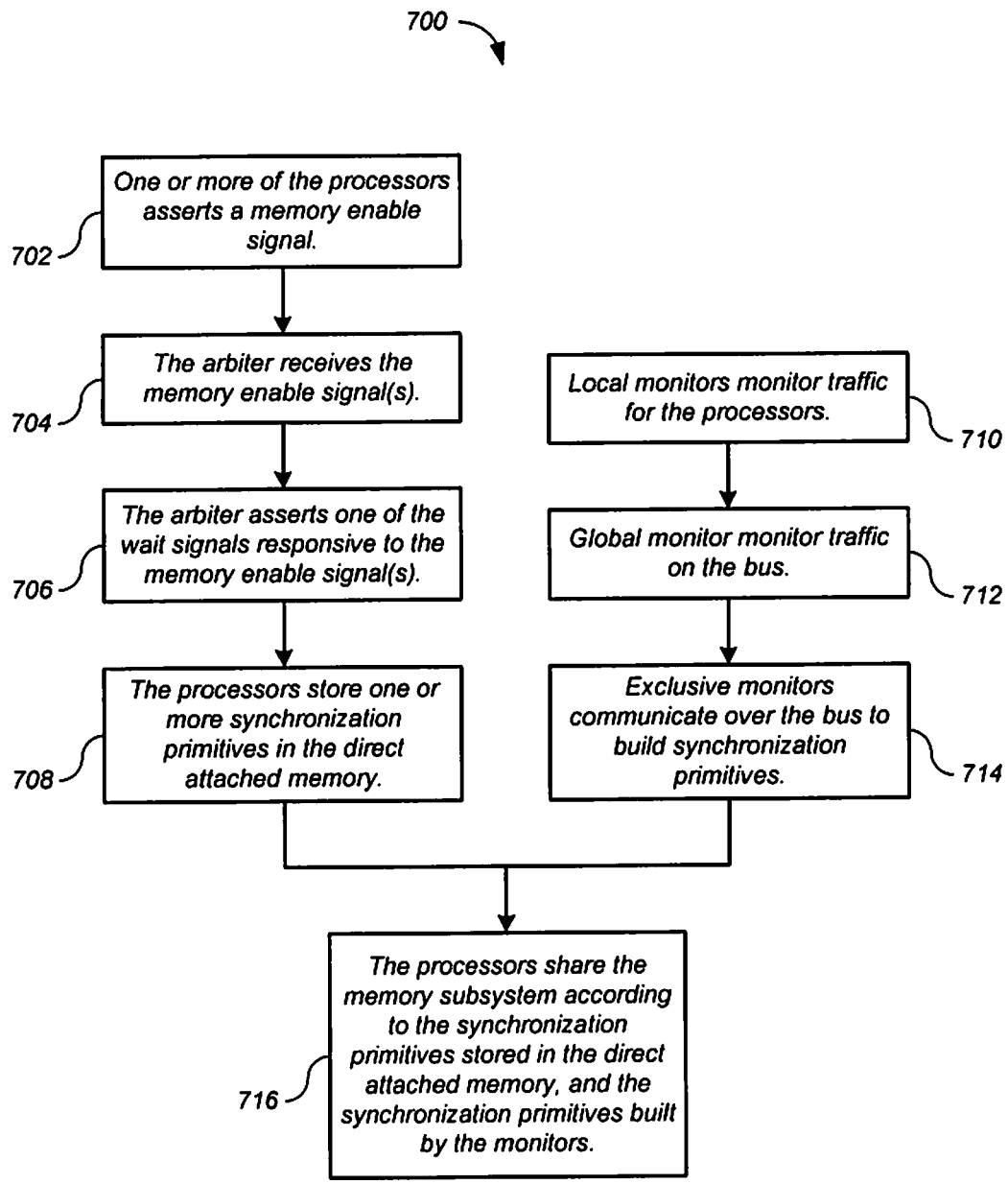
FIG. 7 shows a process for the multiprocessor system of FIG. 6 according to one embodiment.

FIG. 7 shows a process 700 for the multiprocessor system 600 of FIG. 6 according to one embodiment. Although in the described embodiments the elements of process 700 are presented in one arrangement, other embodiments may feature other arrangements. For example, in various embodiments, some or all of the elements of process 700 can be executed in a different order, concurrently, and the like. Also some elements of process 700 may not be performed, and may not be executed immediately after each other. In addition, some or all of the elements of process 700 can be performed automatically, that is, without human intervention.

Referring to FIG. 7, at 702, one or more of the processors 602 asserts a memory enable signal. At 704, the arbiter 606 receives the memory enable signal(s). At 706, responsive to the memory enable signal(s), the arbiter 606 asserts one of the wait signals, thereby granting access to the direct attached memory 604 such that the memory 604 is accessed by only one of the processors 602 at a time. The arbiter asserts the wait signals in accordance with the operation of the state machine 608. The state machine 608 can operate, for example, in accordance with the state diagram 300 of FIG. 3. At 708, the processors 602 store one or more synchronization primitives 612 in the direct attached memory 604.

At 710, the local monitors 620A,B monitor traffic for the processors 602A,B, respectively. At 712, the global monitor 618 monitors traffic on the bus 616. At 714, the exclusive monitors 618, 620 communicate over the bus 616 to build synchronization primitives. At 716, the processors 620 share the memory subsystem 614 according to the one or more synchronization primitives 612 stored in the direct attached memory 604, and the synchronization primitives built by the exclusive monitors 618, 620.

Various embodiments of the present disclosure can be implemented in digital electronic circuitry, or in computer hardware, firmware, software, or in combinations thereof. Embodiments of the present disclosure can be implemented in a computer program product tangibly embodied in a computer-readable storage device for execution by a programmable processor. The described processes can be performed by a programmable processor executing a program of instructions to perform functions by operating on input data and generating output. Embodiments of the present disclosure can be implemented in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, processors receive instructions and data from a read-only memory and/or a random access memory. Generally, a computer includes one or more mass storage devices for storing data files. Such devices include magnetic disks, such as internal hard disks and removable disks, magneto-optical disks; optical disks, and solid-state disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits). As used herein, the term "module" may refer to any of the above implementations.

A number of implementations have been described. Nevertheless, various modifications may be made without departing from the scope of the disclosure. Accordingly, other implementations are within the scope of the following claims.

What is claimed is:
1. An apparatus comprising:
a memory having a plurality of ports;
a plurality of processors, wherein each processor is configured to access a respective port of the memory, and wherein each processor is configured to wait responsive to assertion of a respective wait signal; and
an arbiter configured to:
in response to a first one of the plurality of processors asserting a first one of memory enable signals when a turn signal is in a first state:
assert a first one of the wait signals for a second one of the plurality of processors;

allow the first one of the plurality of processors to access the memory; and
transition the turn signal from the first state to a second state; and
in response to the second one of the plurality of processors asserting a second one of the memory enable signals when the turn signal is in the second state:
assert a second one of the wait signals for the first one of the plurality of processors;
allow the second one of the plurality of processors to access the memory; and
transition the turn signal from the second state to one of (i) the first state and (ii) a third state.

2. The apparatus of claim 1, further comprising:
a common resource;
wherein the memory is configured to store a synchronization primitive; and
wherein the plurality of processors share the common resource according to the synchronization primitive.

3. The apparatus of claim 2, wherein the common resource comprises a memory subsystem.

4. The apparatus of claim 2, further comprising:
a bus in communication with the plurality of processors and the common resource; and
a global monitor configured to monitor traffic on the bus;
wherein each of the plurality of processors comprises a respective local monitor; and
wherein the plurality of processors share the common resource in accordance with the global monitor and the local monitors.

5. The apparatus of claim 4, wherein the bus comprises:
an advanced extensible interface (AXI) bus.

6. The apparatus of claim 1, wherein:
each processor is implemented as a respective core of a multi-core processor.

7. The apparatus of claim 1, wherein:
the memory is implemented as a direct attached memory.

8. An integrated circuit comprising the apparatus of claim 1.

9. A method comprising:
receiving a plurality of memory enable signals asserted by a respective plurality of processors, wherein each processor is configured to access a respective port of a multi-port memory, and wherein each processor is configured to wait responsive to assertion of a respective wait signal;
in response to a first one of the processors asserting a first one of memory enable signals when a turn signal is in a first state:
asserting a first one of the wait signals for a second one of the plurality of processors;
allowing the first one of the plurality of processors to access the memory; and
transitioning the turn signal from the first state to a second state; and
in response to the second one of the plurality of processors asserting a second one of the memory enable signals when the turn signal is in the second state:
asserting a second one of the wait signals for the first one of the plurality of processors;
allowing the second one of the plurality of processors to access the memory; and
transitioning the turn signal from the second state to one of (i) the first state and (ii) a third state.

10. The method of claim 9, further comprising:
storing a synchronization primitive in the multi-port memory; and
sharing a common resource among the processors according to the synchronization primitive.

11. The method of claim 10, wherein the common resource comprises a memory subsystem.

12. The method of claim 10, further comprising:
exchanging traffic between the plurality of processors and the common resource over a bus;
monitoring traffic on the bus using a global monitor;
monitoring traffic for each processor using a respective local monitor; and
sharing the common resource in accordance with the global monitor and the local monitors.

13. The method of claim 9, wherein:
the memory is implemented as a direct attached memory.

14. Non-transitory computer-readable media embodying instructions executable by a computer to perform functions comprising:
receiving a plurality of memory enable signals asserted by a respective plurality of processors, wherein each processor is configured to access a respective port of a multi-port memory, and wherein each processor is configured to wait responsive to assertion of a respective wait signal;
in response to a first one of the plurality of processors asserting a first one of the memory enable signals when a turn signal is in a first state:
asserting a first one of the wait signals for a second one of the plurality of processors;
allowing the first one of the plurality of processors to access the memory; and
transitioning the turn signal from the first state to a second state; and
in response to the second one of the plurality of processors asserting a second one of the memory enable signals when the turn signal is in the second state:
asserting a second one of the wait signals for the first one of the plurality of processors;
allowing the second one of the plurality of processors to access the memory; and
transitioning the turn signal from the second state to one of (i) the first state and (ii) a third state.

15. The non-transitory computer-readable media of claim 14, wherein the functions further comprise:
storing a synchronization primitive in the multi-port memory; and
sharing a common resource among the plurality of processors according to the synchronization primitive.

16. The non-transitory computer-readable media of claim 15, wherein the functions further comprise:
exchanging traffic between the plurality of processors and the common resource over a bus;
monitoring traffic on the bus using a global monitor;
monitoring traffic for each processor using a respective local monitor; and
sharing the common resource in accordance with the global monitor and the local monitors.

17. The non-transitory computer-readable media of claim 14, wherein:
the memory is implemented as a direct attached memory.

* * * * *